United States Patent [19]

Yagi et al.

[11] Patent Number: 5,071,611

[45] Date of Patent: Dec. 10, 1991

[54] METHOD OF MAKING MOLDED RESIN CASING OF ELECTRONIC PART WITH FLAT CABLE

[75] Inventors: Nobuyuki Yagi; Jiroh Inagaki; Kozo Morita, all of Tokyo; Yasutoshi Kaku, Kanagawa; Nobuyuki Kikuchi, Kanagawa; Shinji Mizuno, Kanagawa, all of Japan

[73] Assignee: Teikoku Tsuhin Kogyo Co., Ltd., Kanagawa, Japan

[21] Appl. No.: 447,441

[22] Filed: Dec. 7, 1989

Related U.S. Application Data

[62] Division of Ser. No. 234,946, Aug. 22, 1988, Pat. No. 4,928,082.

[30] Foreign Application Priority Data

Sep. 7, 1987 [JP] Japan .................. 62-224239
Sep. 22, 1987 [JP] Japan .................. 62-238449
Dec. 22, 1987 [JP] Japan .................. 62-325679

[51] Int. Cl.⁵ .................. B28B 1/24; B28B 1/48; B29D 23/22
[52] U.S. Cl. .................. 264/154; 264/163; 264/266; 264/272.15; 264/273
[58] Field of Search .................. 264/154, 163, 271.1, 264/272.11, 273, 275, 328.12, 334, 336, 279, 279.1, 266, 272.15

[56] References Cited

U.S. PATENT DOCUMENTS

| | | | |
|---|---|---|---|
| 3,444,618 | 5/1969 | Sorlie | 29/629 |
| 3,800,368 | 4/1974 | Simon | 264/154 |
| 3,809,733 | 5/1974 | Sandiford et al. | 264/45 |
| 4,429,297 | 1/1984 | Nakatsu | 338/162 |
| 4,477,795 | 10/1984 | Henmi et al. | 338/163 |
| 4,479,106 | 10/1984 | Shimizu et al. | 336/160 |
| 4,479,107 | 10/1984 | Bleeke | 338/176 |
| 4,705,469 | 11/1987 | Liebl et al. | 264/273 |
| 4,734,672 | 3/1988 | Kawana et al. | 338/312 |

FOREIGN PATENT DOCUMENTS

| | | |
|---|---|---|
| 2434866 | 9/1975 | Fed. Rep. of Germany . |
| 2267617 | 11/1975 | France . |
| 2335023 | 7/1977 | France . |
| 62-49601 | 3/1987 | Japan . |

*Primary Examiner*—Jan H. Silbaugh
*Assistant Examiner*—Angela Ortiz
*Attorney, Agent, or Firm*—Wenderoth, Lind & Ponack

[57] ABSTRACT

A molded resin casing of an electronic part equipped with a flat cable and internally accommodating a board on which are formed electric conductor patterns slidingly contacted by contacts of a slider of the electronic part. A flexible board having various electric conductor patterns formed on a synthetic resin film is used as the board, the flexible board is formed integral with a flat cable including a synthetic resin film on which are formed electric conductor patterns electrically connected to the aforementioned various electric conductor patterns, and when the molded resin casing is molded by injecting a molten synthetic resin, the flexible board is inserted in such a manner that the electric conductor patterns are exposed within the casing, thereby integrating the flexible board and synthetic resin casing, with the flat cable extending outwardly from a side portion of the synthetic resin casing.

4 Claims, 17 Drawing Sheets

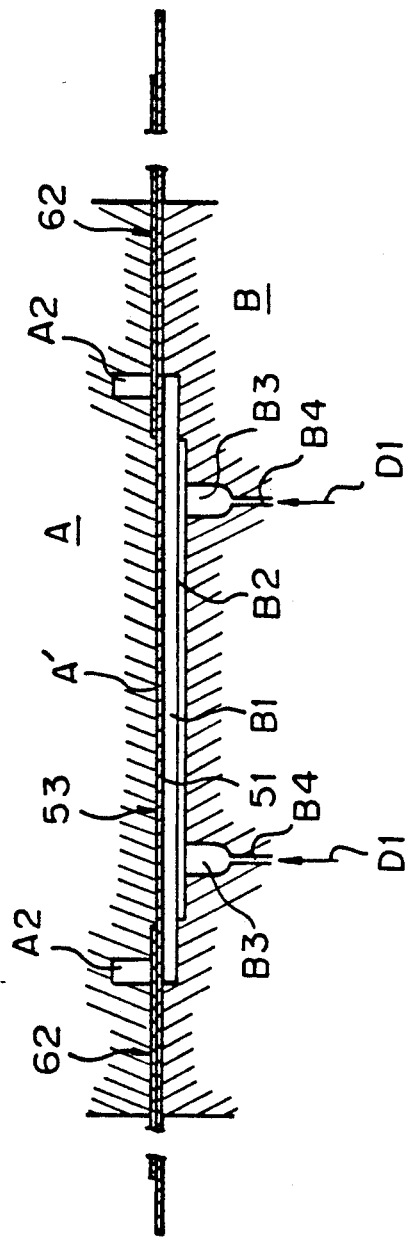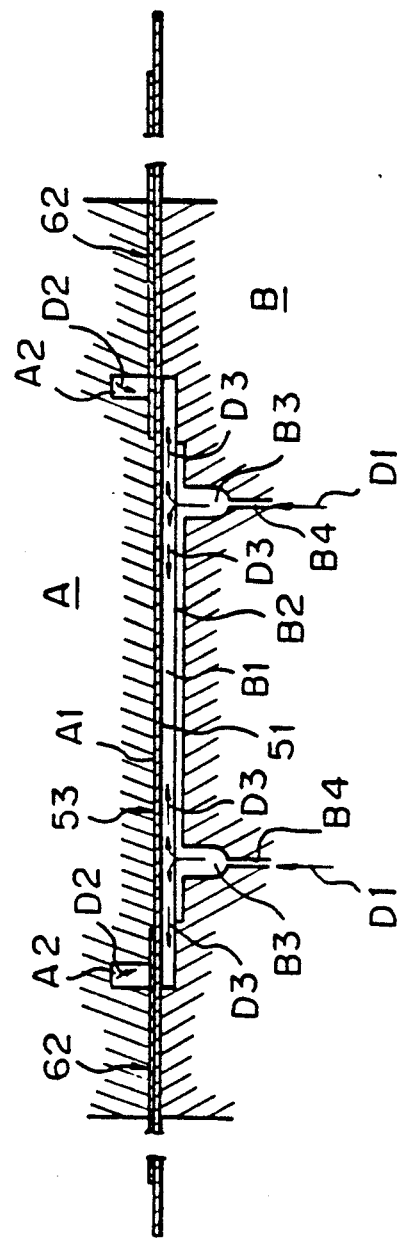

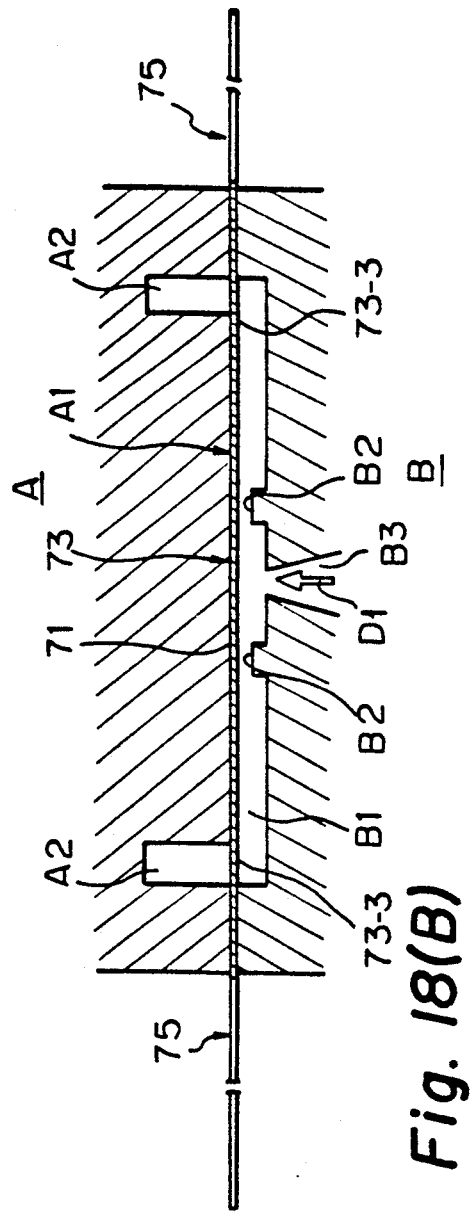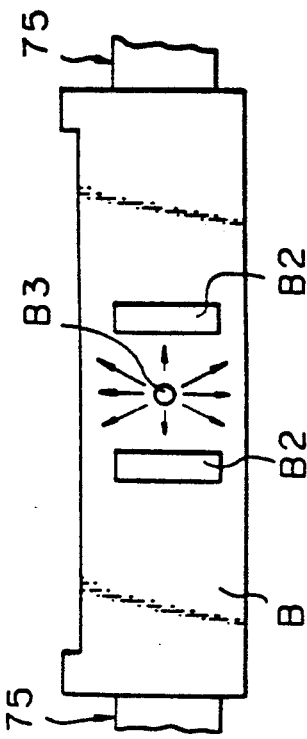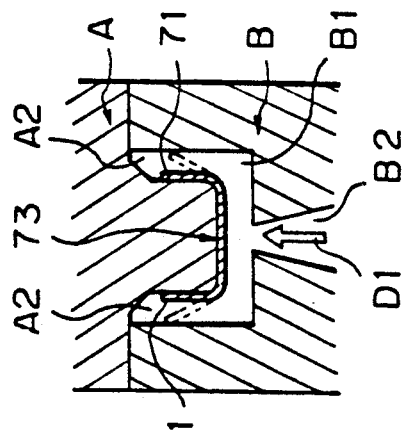

METHOD OF MAKING MOLDED RESIN CASING OF ELECTRONIC PART WITH FLAT CABLE

This application is a division of application Ser. No. 07/234,946, filed Aug. 22, 1988, now U.S. Pat. No. 4,928,082.

BACKGROUND OF THE INVENTION

1. Field of the Invention

An electronic part such as a rotary- or sliding-type variable resistor, a rotary- or sliding-type code switch or the like which finds use in electronic apparatus includes a board on which various patterns are formed by printing, a casing, and a slider having contacts brought into sliding contact with the patterns formed on the board. The board is fixed to the bottom of the casing and the slider is supported on the board so as to rotate or slide freely. The components such as the board, the casing and the slider are manufactured as separate elements and are subsequently assembled into a finished electronic part by an assembly process.

2. Description of the Related Art

As the result of success in achieving a reduction in the size and thickness of electronic parts, it has also been attempted to reduce the size and thickness of the casings for rotary- or sliding-type variable resistors and rotary- or sliding-type switches in recent years. However, since the rotary- and sliding-type electronic parts of the conventional construction are composed of elements that are manufactured separately and then assembled into a whole there is a limitation upon the size and thickness reduction that can be achieved. The more progress that is made in reducing size and thickness, the more difficult it is to assemble the individual elements into the finished product.

Furthermore, when an electronic part of reduced size and thickness is installed in an electronic apparatus and lines such as signal lines are connected between the part and the external apparatus, it is difficult to connect the lines to the miniature terminal portion of the electronic part and the connections involve problems in terms of reliability.

SUMMARY OF THE INVENTION

Accordingly, an object of the present invention is to solve the aforementioned problems and provide a molded resin casing of an electronic part equipped with a flexible flat cable in which a flexible board and a flat cable are integrally formed of a thermoplastic synthetic resin film. The flexible flat cable is composed of a base thermoplastic resin film on which conductive patterns are disposed. The flexible board is inserted in a molded synthetic resin casing, thereby integrating the board, the casing and the flexible flat cable to dispense with the need to assemble the board and the casing, thus making possible a great reduction in size and thickness required for modern electronic parts and dispensing with the need to connect a cable to the terminal portion of the electronic part.

According to the present invention, the foregoing object is attained by providing a molded resin casing of a rotary- or sliding-type electronic part internally accommodating a board on which are formed electric conductor patterns slidingly contacted by contacts of a slider of the electronic part, wherein a board portion and a flexible flat cable portion are integrally formed on a film comprising a thermoplastic synthetic resin material, electric conductor patterns are formed on the board portion and flexible flat cable portion, and the board portion is inserted in a synthetic resin casing in such a manner that the electric conductor patterns are exposed to the inner walls of the casing.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 1 illustrates the structure of a molded resin casing of an electronic part equipped with a flexible flat cable in accordance with the present invention, in which

FIG. 6 illustrates the structure of a molded resin casing of an electronic part in which the casing has an internal flexible board in accordance with another embodiment of the present invention, in which

FIG. 9 illustrates the structure of a molded resin casing of an electronic part with a flexible flat cable in accordance with a third embodiment of the present invention, in which

FIGS. 12(A) and (B) are views useful in describing a method of inserting the flexible board in the molded resin casing;

FIGS. 14 and 15 are views illustrating the structure of a molded resin casing of an electronic part in which the casing has an internal flexible board with a flexible flat cable in accordance with a fourth embodiment of the present invention, in which FIG. 14 is a perspective view, FIG. 15(A) a plan view of the casing, FIG. 15(B) a partial side section thereof, FIG. 15(C) a back view thereof and FIG. 15(D) a sectional view taken along line A—A of FIG. 15(A);

FIG. 17 illustrates the structure of a variable resistor using the molded resin casing with the flexible flat cable shown in FIG. 14, in which

FIGS. 18(A), (B) and (C) are views useful in describing a method of inserting the flexible board in the molded resin casing;

DESCRIPTION OF THE PREFERRED EMBODIMENTS

Preferred embodiments of the invention will now be described with reference to the drawings.

Figure 1A:
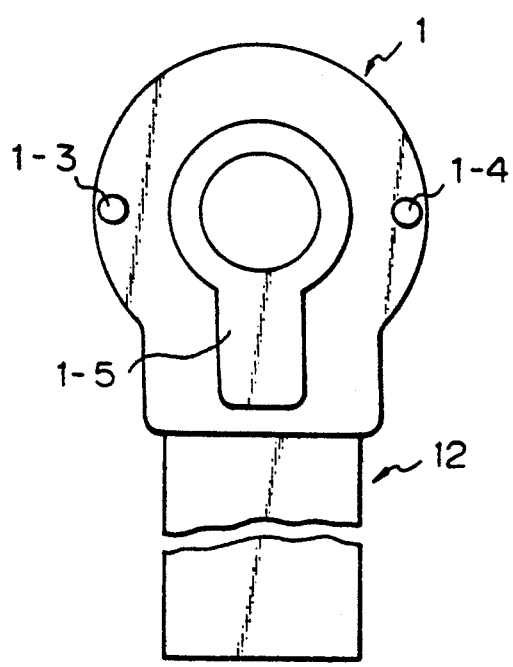
FIG. 1(A) is a back view of the casing, FIG. 1(B) a side view of the casing and FIG. 1(C) a plan view of the casing and FIG. 1(D) a plan view illustrating the structure of a terminal portion.
Figure 1B:
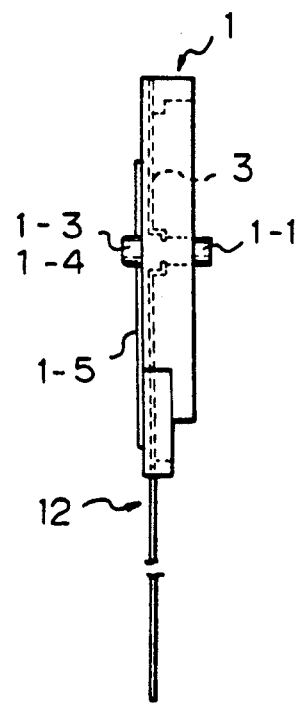
Figure 1C:
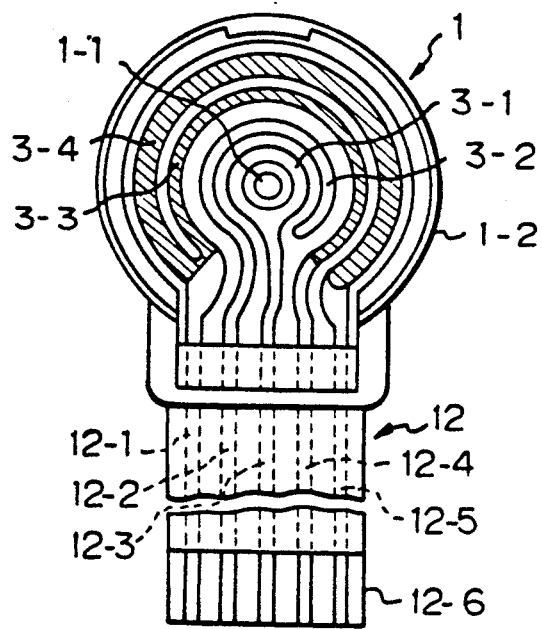
Figure 1D:
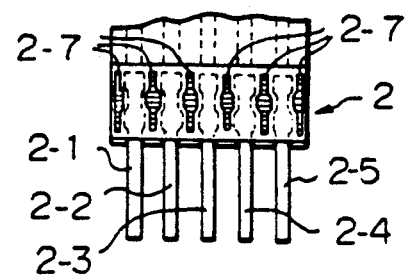

FIG. 1 illustrates the structure of a molded resin casing of an electronic part equipped with a flexible flat cable in accordance with the present invention, in which FIG. 1(A) is a back view of the casing, FIG. 1(B) a side view of the casing, FIG. 1(C) a plan view of the casing and FIG. 1(D) a plan view showing the structure of a terminal in a case where the end of the flexible flat cable is provided with terminals. In this embodiment, the description will relate to a rotary-type variable resistor as an example of the electronic part.

As illustrated in the figures, a casing 1 of a rotary-type variable resistor has a flexible board 3 inserted therein, and a flexible flat cable 12 formed integrally with the flexible board 3 extends outwardly from the side of the casing 1. The end of the flexible flat cable 12 is provided, when required, with a terminal portion 2 having metallic terminal pieces 2-1 through 2-5.

The interior of the molded casing 1 is generally circular in shape and is provided with a side wall 1-2 along its periphery. The bottom of the casing 1 is provided at its central portion with a support 1-1 on which a rotary slider, described below, is supported for free rotation. The back side of the molded casing 1 is formed to have protrusions 1-3, 1-4.

The flexible board 3 includes collector patterns 3-1, 3-2 and resistor patterns 3-3, 3-4 formed on a resin film by printing. These collector patterns 3-1, 3-2 and resistor patterns 3-3, 3-4 on flexible board 3 are exposed at the bottom of the casing 1.

Wiring patterns 12-1 through 12-5 continuous with the end portions of the collector patterns 3-1, 3-2 and resistor patterns 3-3, 3-4 are formed on the flexible flat cable 12, and the wiring patterns are electrically insulated by forming a resin coating layer on the flexible flat cable 12 except at a portion thereof serving as a terminal portion 12-6.

The structure, shape and method of manufacture of the components making up the foregoing rotary-type variable resistor casing will now be described.

Figure 2:
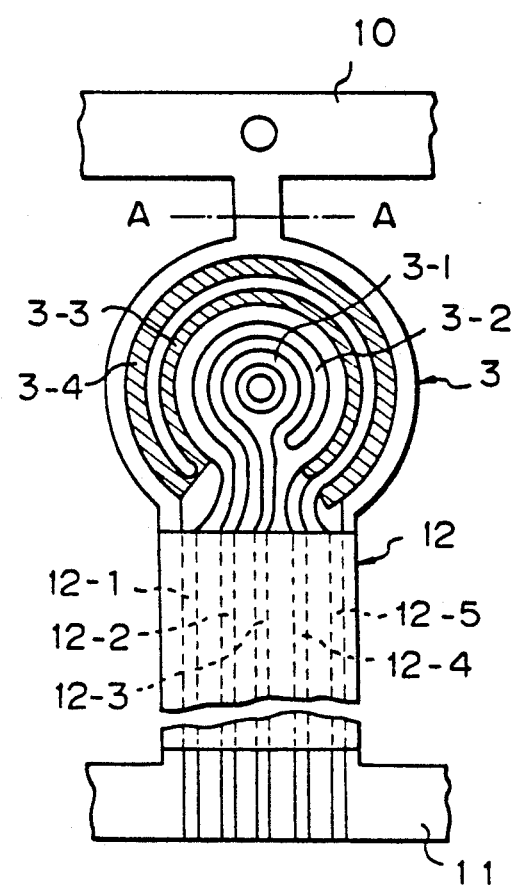
FIGS. 2 and 3 are views useful in describing a method of manufacturing a flexible board and a flexible flat cable.

FIG. 2 is a view useful in describing the structure and method of manufacturing the flexible board 3 formed integrally with the flexible flat cable 12 and inserted in the molded resin casing of the rotary-type variable resistor set forth above.

To manufacture the flexible board 3 formed integrally with the flexible flat cable 12, first a strip of thermoplastic, heat-resistant synthetic resin film is prepared. The collector patterns 3-1, 3-2 and the resistor patterns 3-3, 3-4 are formed on predetermined portions of the synthetic resin film by printing, thereby defining a portion corresponding to the flexible board 3, and the wiring patterns 12-1 through 12-5 continuous with the collector patterns 3-1, 3-2 and resistor patterns 3-3, 3-4 are formed on the flexible flat cable 12. After these patterns are formed, the synthetic resin film is cut, leaving the portions corresponding to the flexible flat cable 12 and the flexible board 3 and support strips 10, 11 at the upper and lower ends. In this way a number of flexible boards 3 integrated with the flexible flat cables 12 and connected by the support strips 10, 11 can be made. In this case, it is obvious that the formation of the collector patterns 3-1, 3-2, resistor patterns 3-3 3-4 and wiring patterns 12-1 through 12-5 by printing can be carried out after the synthetic resin film is cut leaving the portion corresponding to the flexible board 3 and support strips 10, 11. Examples of the synthetic resin film are films made of polyparabanic acid, polyether imide and polyethylene terephthalate.

Figure 3:
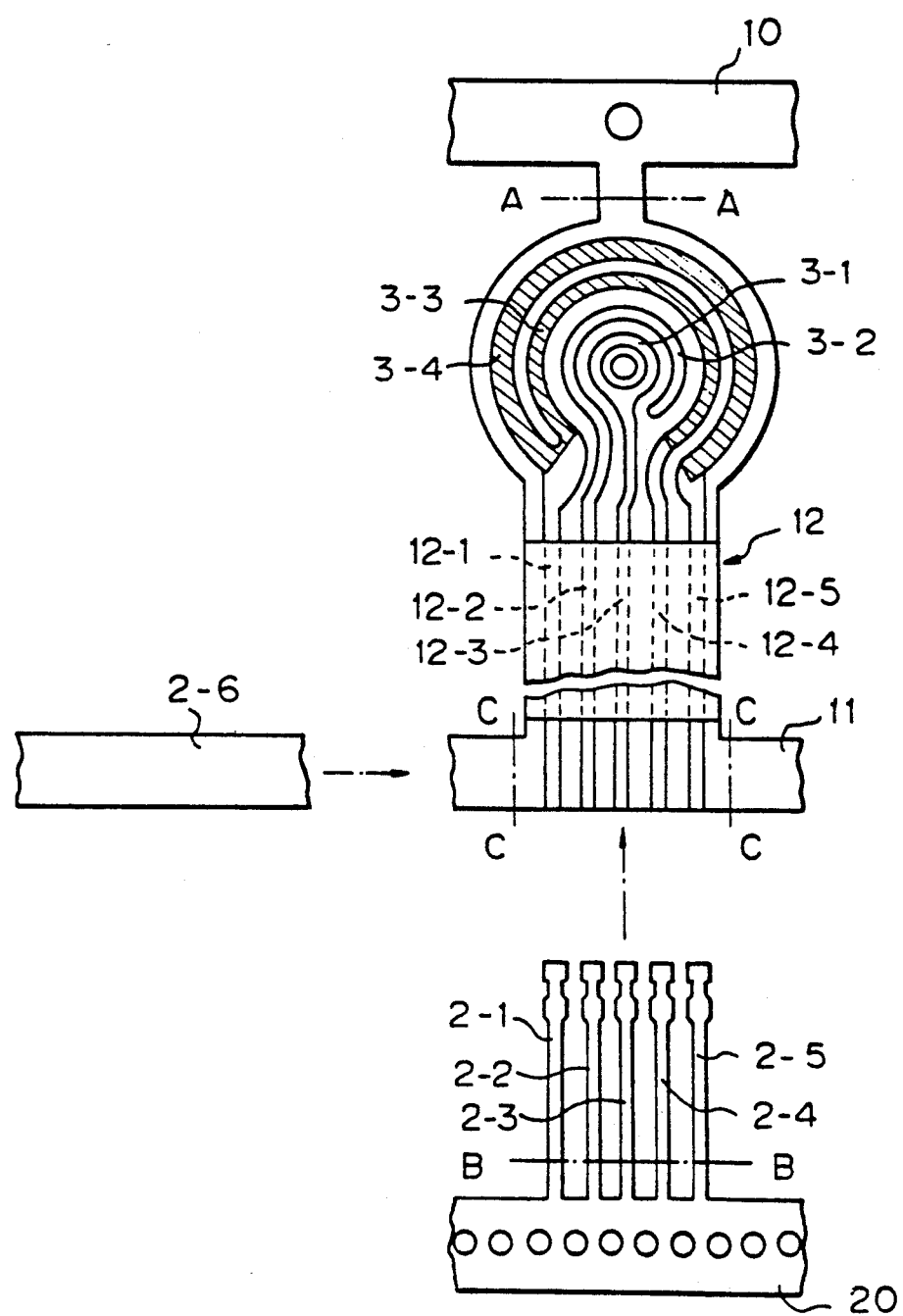

In a case where the end portion of the flexible flat cable 12 is provided with the terminal portion 2, as shown in FIG. 1(D), the metallic terminal pieces 2-1 through 2-5 formed integrally with a support strip 20 are prepared, as shown in FIG. 3, an electrically conductive adhesive layer is formed on the end portions of the wiring patterns 12-1 through 12-5 on the flexible flat cable 12, and the tips of the metallic electrode pieces 2-1 through 2-5 are placed on respective ones of these end portions to be joined thereto by the adhesive.

Next, a reinforcing sheet 2-6 made of a synthetic resin film of a substance the same as that of the flexible flat cable 12 is placed on the metallic terminal pieces 2-1 through 2-5 that have been joined to the wiring patterns 12-1 through 12-5, a horn (not shown) for emitting ultrasonic waves is placed upon portions [indicated at 2-7 in FIG. 1] of the reinforcing sheet 2-6 at which the metallic terminal pieces 2-1 through 2-5 are not present, and these portions are irradiated with ultrasonic waves from the horn. As a result, the synthetic resin film forming the reinforcing sheet 2-6 and the synthetic resin film forming the flexible board 3 are fused locally by ultrasonic heating, so that the metallic terminal pieces 2-1 through 2-5 are rigidly secured onto the respective wiring patterns 12-1 through 12-5 by the contractile force of the synthetic resin films.

The metallic terminal pieces 2-1 through 2-5 are then heated by a heating iron from above the reinforcing sheet 2-6 or flexible board 3 to melt the aforementioned electrically conductive adhesive layer, thereby reliably bonding the metallic terminal pieces 2-1 through 2-5 onto the wiring patterns 12-2 through 12-5.

It should be noted that since the synthetic resin films are strongly fused together by the ultrasonic heating process, it may be permissible in certain cases to omit the step in which the wiring patterns 12-1 through 12-5 and the metallic terminal pieces 2-1 through 2-5 are bonded together by the electrically conductive adhesive. Next, by cutting along lines A—A, B—B and C—C in FIG. 3(A), the flexible flat cable 12 having the terminal portion 2 and the flexible board 3 are completed.

A method of inserting the flexible board 3 formed integrally with the flexible flat cable 12 having the foregoing construction into the resin molded casing 1 will now be described.

Figure 4A:
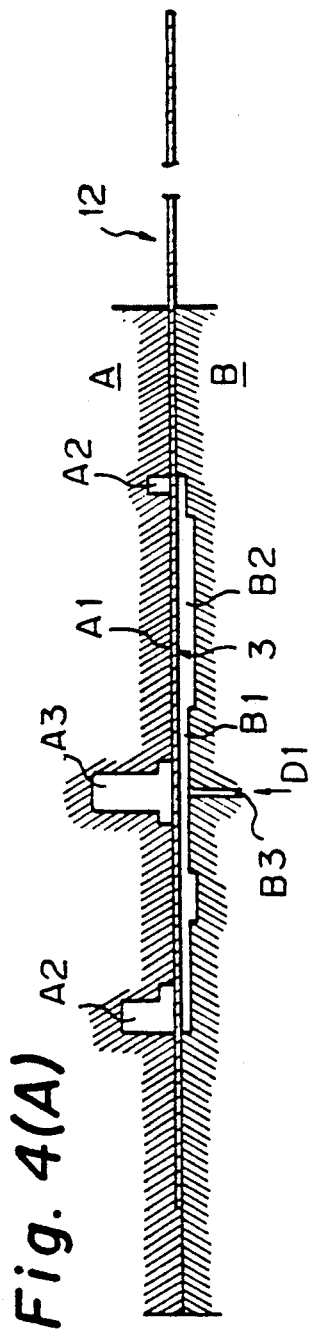
FIGS. 4(A), (B) and (C) are views useful in describing a method of inserting the flexible board in the molded resin casing.

As shown in FIG. 4(A), the flexible board 3 is clamped between a first die A and a second die B.

The first die A has a planar, flat surface A1 formed in its central portion, an annular groove A2 formed about the periphery of the flat surface A1, and a columnar hole A3 formed in the central portion of the flat surface A1. The flat surface A1 is closely contacted by the collector patterns 3-1, 3-2 and resistor patterns 3-3, 3-4 of the flexible board 3, the annular groove A2 forms the side wall 1-2 of the molded casing 1, and the hole A3 forms the support 1-1 of the molded casing 1.

The second die B is formed to have a recess B1 in a portion to which the flat surface A1 and annular groove A2 of the first die A correspond, a channel B2 of a prescribed width for promoting the inflow of molten resin toward the terminal portion 2 of the flexible board 3, and a filling bore B3 formed substantially at the central portion of the channel B1. The recess B1 is for forming the bottom portion of the resin molded casing 1, and the channel B2 is for facilitating the inflow of molten resin along the back surface of the flexible board in the direction of the flat cable 12, which is formed integral with the flexible flat board 3, when the molten resin is introduced under pressure from the filling bore B3.

Figure 4B:
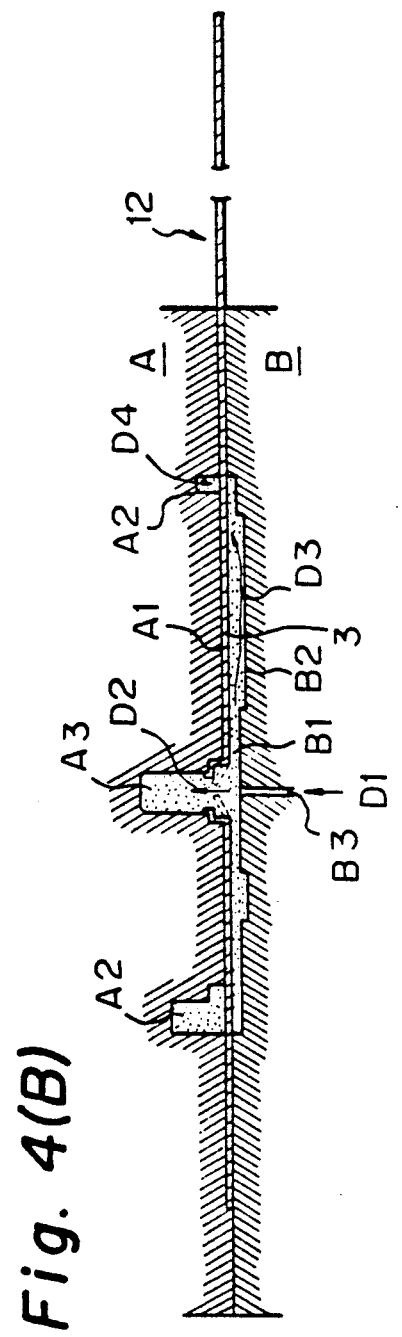

As shown in FIG. 4B a molten resin material (e.g., polyphenylene sulfide, polyethylene terephthalate or the like) is injected under pressure from the filling bore B3 of the second die B, as indicated by the arrow D1. Owing to this injection of the molten resin, the molten resin fills the recess B1 and channel B2 of the second die B as well as the annular groove A2 of the first die A, and the synthetic resin film forming the flexible board 3 is punctured by the synthetic resin material, which therefore is allowed to fill the hole A3 that forms the support 1-1 of the molded casing 1, as indicated by arrow D2. Thus, the hole A3 which forms the support 1-1 is filled with the molten resin material that burst through the flexible board 3, thereby bringing the synthetic resin film into close contact with the inner surface of the hole A3 so that the film will not peel away from this inner surface.

If, instead of adopting the foregoing method, an inflow hole for allowing inflow of the molten resin material were to be provided beforehand in a portion of the flexible board 3 corresponding to the position of the hole A3, the molten resin material which has flowed into the hole A3 through the inflow hole would impact against the inner surface of the hole A3 and reverse in direction. Consequently, this portion of the synthetic resin material would make its way between the flexible board 3 and the wall surface of the first die A, thereby causing the flexible board 3 to separate from the wall surface of the first die A so that the surfaces of the collector patterns 3-1, 3-2 and resistor patterns 3-3, 3-4 of the flexible board 3 would become covered with the resin material. The result would be a defective product.

However, in accordance with the present embodiment, this problem is solved by allowing the flexible board 3 to be punctured by the injection of the molten resin material, as described above, instead of adopting the arrangement in which the flexible board 3 is provided with the inflow hole in advance.

If the second die B were not formed to have the channel B2, the molten resin material at the time of filling operation would flow around the die from the recess B1 through the surrounding annular groove A2 and would first fill the die from the upper surfaces of the flexible board 3 and flexible flat cable 12, which are situated below the annular groove A2, as a result of which the terminal portion 2 of the flexible board 3 would be urged downwardly toward the recess B1 of the second cavity B. In extreme cases, there is the danger that this might cause the flexible board 3 and flexible flat cable 12 to become exposed at the back surface of the casing.

In this embodiment, the foregoing problem is avoided by forming the channel B2 in the second die B so that the flow of the molten resin material from the central portion of the recess B1 to the flexible flat cable 12 will be fastest at the portion (the direction indicated by arrow D3) where it flows in through the channel B2. Therefore, the periphery of the terminal portion 2 of the flexible board 3 is filled with the molten resin material while the terminal portion 2 is urged against the wall of the first die A. In other words, since a force indicated by arrow D3 acts before a force produced by the inflow of the molten resin material in the direction of arrow D4 in FIG. 4(B), the terminal portion 2 will not be peeled off the first die A.

After the clearance between the first die A and the second die B is thus filled with the molten resin material and the latter is allowed to solidify, the first and second dies A, B are parted. The result is a molded resin casing of an electronic part equipped with a flexible flat cable in which the flexible board 3 of the kind shown in FIG. 1 is inserted in the molded resin casing 1.

It should be noted that the raised surface 1-5 on the back side of the molded casing 1 shown in (A) and (B) of FIG. 1 is formed by the channel B2 of second die B.

Figure 4C:
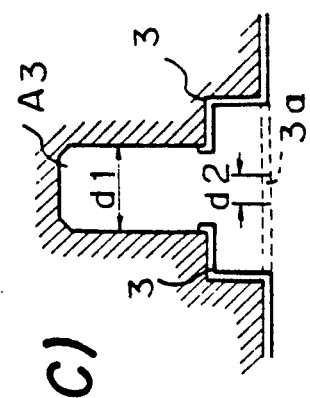

In the embodiment described above, the flexible board 3 is not formed to have a molten resin inflow hole at the portion corresponding to the position of the hole A in the first die A. However, if the flexible board 3 is formed beforehand to have a molten resin inflow hole 3a, as shown in (C) of FIG. 4, the molten resin material which has flowed into the hole 3a can be prevented from seeping between the flexible board 3 and the wall surface of the first die A if the diameter $d_2$ of the hole 3a is made less than one-half the diameter $d_1$ of the hole A3 for forming the support 1-1. It has been confirmed that the flexible board 3 will not separate from the wall surface of the first die A if such an arrangement is adopted.

Figure 5:
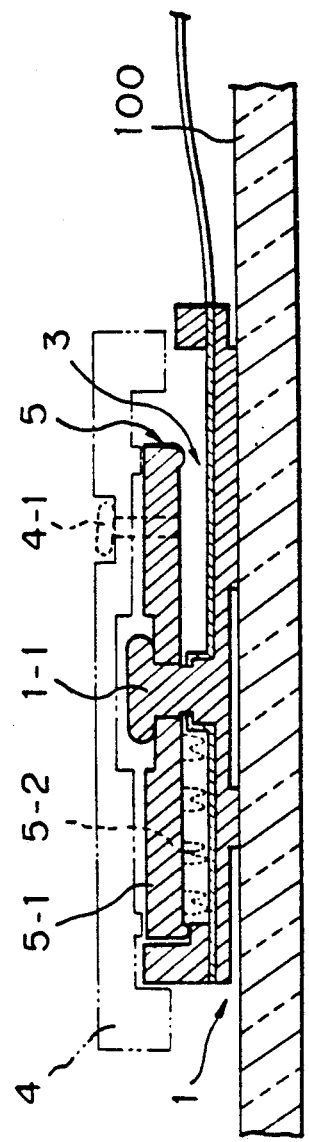
FIG. 5 is a sectional side view illustrating a rotary-type variable resistor fabricated using a molded resin casing of an electronic part with a flexible flat cable.

FIG. 5 is a sectional side view illustrating a rotary-type variable resistor in which use is made of the above-described molded resin casing having the flexible flat cable.

As shown in FIG. 5, a rotor 5 has a structure comprising a disk-shaped rotor main body 5-1 consisting of a synthetic resin, and a slider 5-2 furnished on the bottom surface of the rotor main body 5-1. The support 1-1 of the molded casing 1 is inserted into a hole formed in the central portion of the rotor main body 5-1, and the rotor 5 is freely rotatably supported within the molded casing 1 by thermally caulking the distal end of the support 1-1. Rotating the rotor 5 causes contacts on the slider 5-2 to slide on the collector patterns 3-1, 3-2 and resistor patterns 3-3, 3-4 formed on the flexible board 3, thereby changing the resistance values between the wiring patterns 12-1 through 12-5 on the flexible flat cable 12.

If the rotary-type variable resistor having the above-described construction is mounted on a printed circuit board 100, the variable resistor is positioned and attached using the protrusions 1-3, 1-4 formed on the back surface of the molded casing 1 near the opposing edges thereof. At such time the flexible flat cable 12 is free to bend with respect to the printed circuit board 100. As a result, the flexible flat cable 12 can be freely arranged within and led out to the exterior of an electronic apparatus with ease.

By thus integrally forming the flexible flat cable 12 and the flexible board 3 of a synthetic resin film and integrating the flexible board 3 with the molded resin casing 1 in the form of an insert within the casing, not only is it no longer necessary to assemble the molded casing 1 and the flexible board 3, but it is also possible to achieve a reduction in size and thickness and dispense with the need to connect wires to the terminals of the part.

Further, it has been described in the foregoing embodiment that the patterns are formed on the flexible board 3 by the printing application of an electrically conductive paste. However, the invention is not limited to this embodiment. By way of example, it is possible to form the patterns by forming an electrically conductive foil such as of aluminum or copper on the synthetic resin film by adhesion using an adhesive or by vacuum deposition, followed by forming the foil into predetermined pattern shapes by an etching treatment.

Figure 6A:
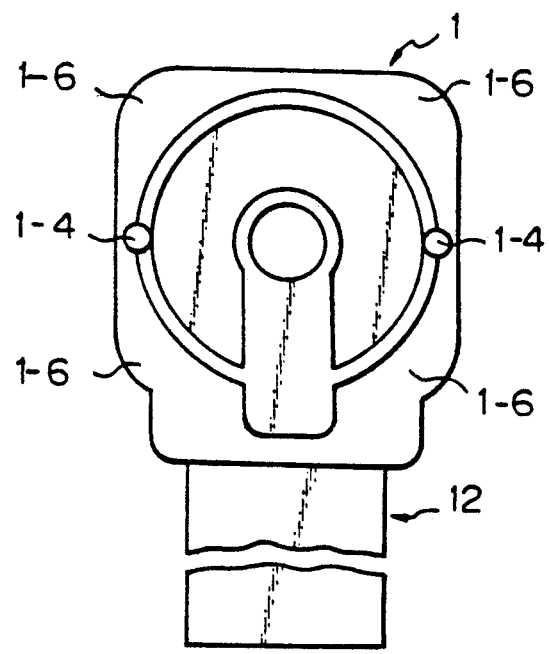
FIG. 6(A) is a back view of the casing, FIG. 6(B) a side view of the casing and FIG. 6(C) a plan view of the casing.
Figure 6B:
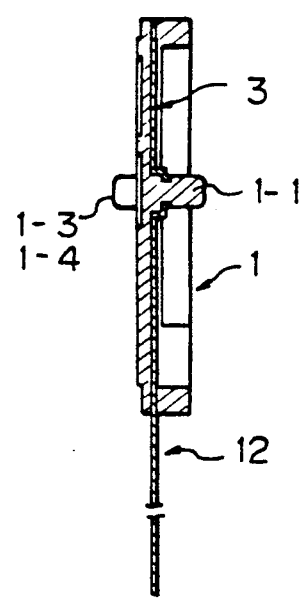
Figure 6C:
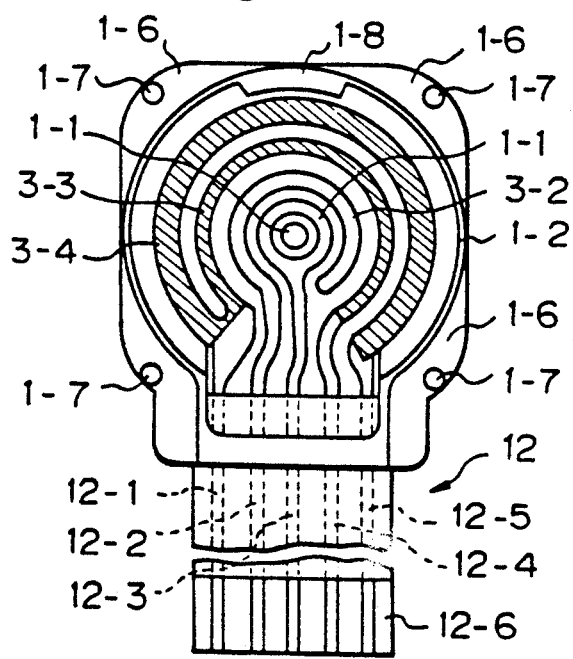

FIG. 6 illustrates the structure of a molded resin casing of an electronic part equipped with a flexible flat cable in accordance with a second embodiment of the present invention, in which (A) is a back view of the casing, (B) a side view of the casing and (C) a plan view of the casing. The wiring patterns 12-1 through 12-5 continuous with the end portions of the collector patterns 3-1, 3-2 and resistor patterns 3-3, 3-4 are formed on the flexible flat cable 12, and the wiring patterns are electrically insulated by forming a resin coating layer on the flexible flat cable 12 except at a portion thereof serving as the terminal portion 12-6. The flexible board 3 and a portion of the flexible flat cable 12 are inserted in the molded resin casing 1. The method of manufacturing this molded resin casing of an electronic part internally accommodating the above-described flexible board is the same as that for the casing shown in FIG. 1 and need not be described again.

The end portion 12-6 of the flexible flat cable 12 may be provided with the terminal portion 2 having the metallic terminal pieces 2-1 through 2-5.

Figure 7:
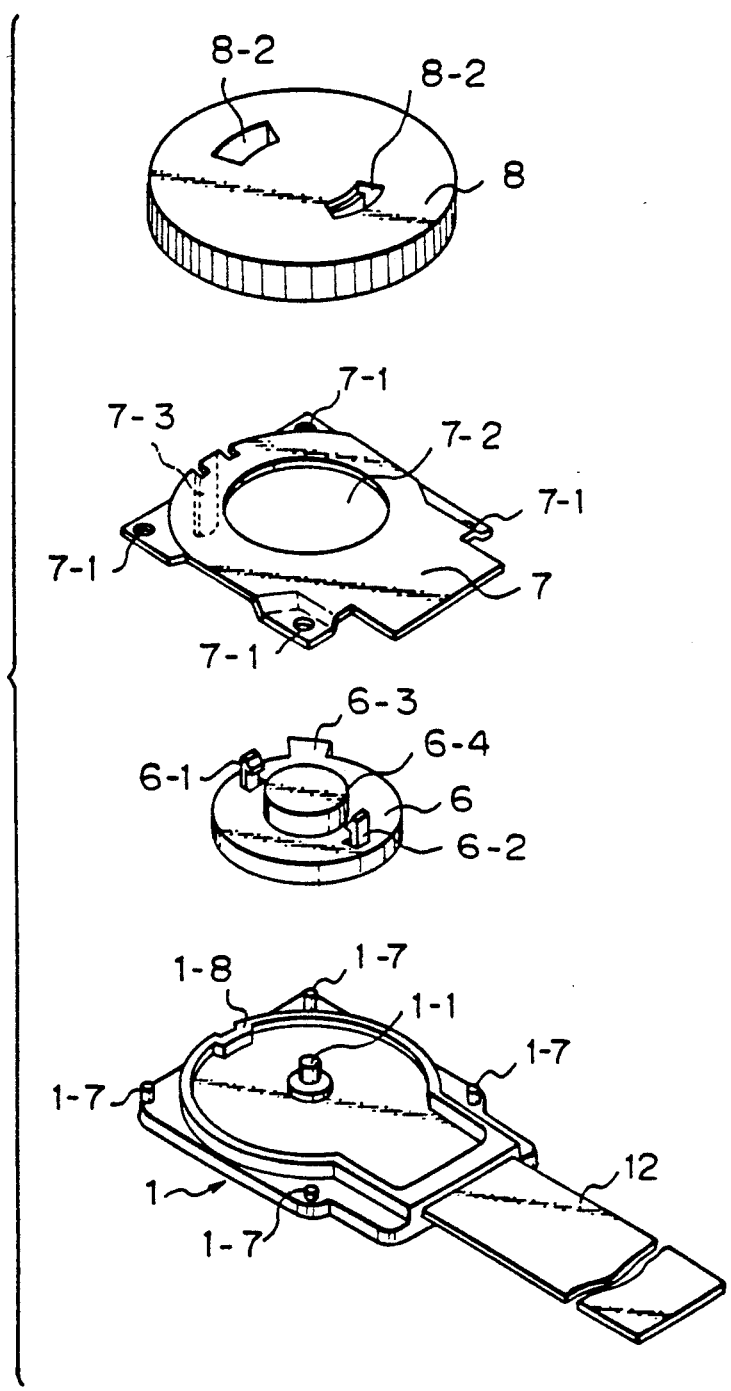
FIG. 7 is an exploded, perspective view illustrating a rotary-type variable resistor using the molded resin casing shown in FIG. 6.

FIG. 7 is an exploded, perspective view illustrating a rotary-type variable resistor using the molded resin casing shown in FIG. 6. The rotary-type variable resistor includes the molded resin casing 1, a rotor 6, a cover plate 7 and a rotating knob 8.

The rotor 6 has the shape of a disk the central portion whereof is formed to have a columnar projection 6-4. The rotor 6 is also formed to include a pair of locking fingers 6-1, 6-2 on either side of the projection 6-4 for the purpose of attaching the rotating knob 8, and a projection 6-3 for limiting the rotation of the rotor 6 to a predetermined range. Though not shown, a slider 6-6 for coming into sliding contact with the collector patterns 3-1, 3-2 and resistor patterns 3-3, 3-4 of the flexible board 3 is attached to the lower portion of the rotor 6 (see FIG. 8).

The cover plate 7 comprises a metal plate having a central portion formed to include a through-hole 7-2 through which the locking fingers 6-1, 6-2 of the rotor 6 are passed, and four corner portions each formed to include a hole 7-1 through which a corresponding one of the projections 1-7 of molded casing 1 is passed. The central portion of the front edge of the cover plate 7 is provided with a downwardly projecting leg 7-3.

The rotating knob 8 is a disk-shaped member the periphery of which is roughened. As will be described below, a projection 8-4 (see FIG. 8) the central portion whereof is formed to have a hole 8-3 (FIG. 8) into which the projection 6-4 of rotor 6 is inserted is provided on the lower central portion of the rotating knob 8, and holes 8-2, 8-2 into which the locking fingers 6-1, 6-2 of rotor 6 are inserted are formed in the knob 8 on either side of the projection 8-4. The holes 8-2, 8-2 each have a wall face provided with a step portion engaged by the corresponding locking finger.

Figure 8:
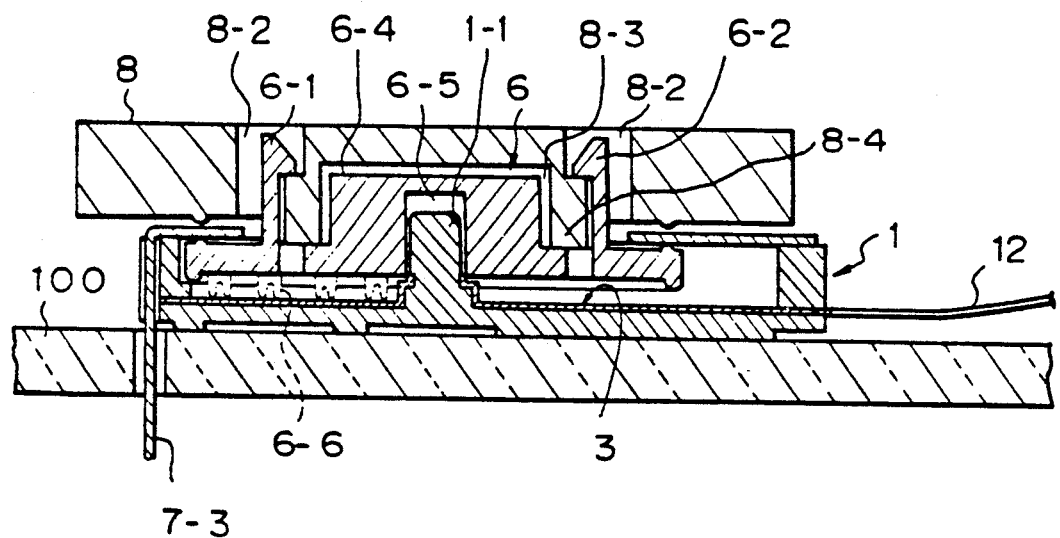
FIG. 8 is a sectional view showing the rotary-type variable resistor in the assembled state.

FIG. 8 is a sectional view showing the rotary-type variable resistor comprising the foregoing components in the assembled state mounted on the printed circuit board 100.

To assemble the rotary-type variable resistor, the rotor 6 is placed on the molded resin casing 1 with the support 1-1 formed on the central portion of the molded resin casing 1 being inserted into the hole 6-5 formed in the lower central portion of the rotor 6. Next, the projections 1-7 at the four corners of the molded resin casing 1 are inserted into the holes 7-1 at the four corners of the cover plate 7 and the tips of the projections 1-1 are thermally caulked, thereby attaching the casing 1 to the cover plate 7. Thus, the projection 6-3 and the pair of locking fingers 6-1, 6-2 of the rotor 6 are passed through the through-hole 7-2 of the cover plate 7.

Next, the projection 6-4 of rotor 6 is inserted into the hole 8-3 formed in the projection 8-4 on the bottom of rotating knob 8, and the locking fingers 6-1, 6-2 are inserted into the holes 8-2, 8-2 and made to engage the step portions formed on the wall faces of the holes 8-2, 8-2, thereby attaching the rotating knob 8 to the rotor 6.

When the rotating knob 8 in the rotary-type variable resistor having the foregoing construction is turned, the rotor 6 rotates so that the slider 6-6 attached to the lower portion thereof is brought into sliding contact with the collector patterns 3-1, 3-2 and resistor patterns 3-3, 3-4 on the flexible board 3. When the rotor 6 rotates a predetermined amount, the projection 6-3 formed on the circumferential portion thereof abuts against a projection 1-8 formed on the inner peripheral surface of the casing side wall 1-2. As a result, the rotation of rotor 6 is limited to a predetermined range.

In the foregoing embodiment, an example has been described in which the molded casing is that of a rotary-type variable resistor. However, the molded casing can also be used as the molded casing of an internally accommodated flexible board of a rotary-type electronic part such as a rotary-type code switch. In such case, most of the component parts of the above-described embodiment can be utilized, and only the shapes of the electric conductor patterns formed on the flexible board 3 need be changed.

Figure 9A:
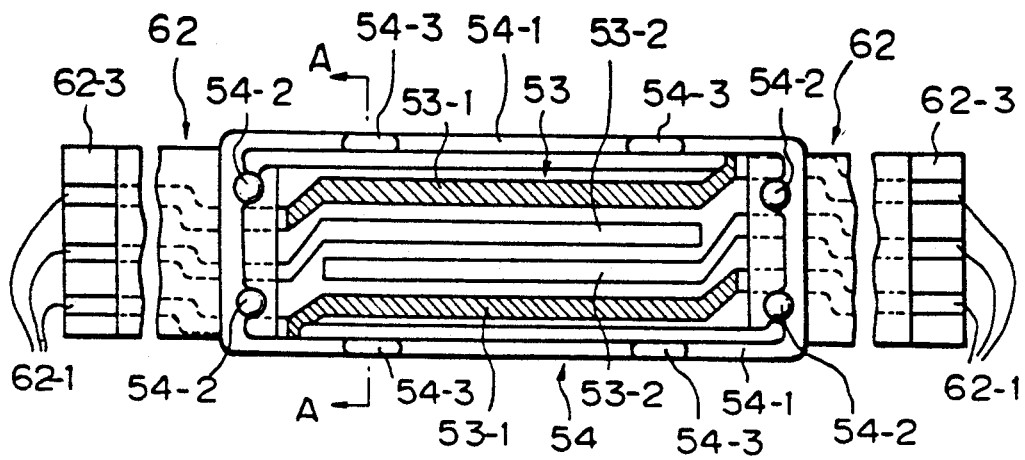
FIG. 9(A) is a plan view of the casing, FIG. 9(B) a partial side section of the same and FIG. 9(C) a back view.
Figure 9B:
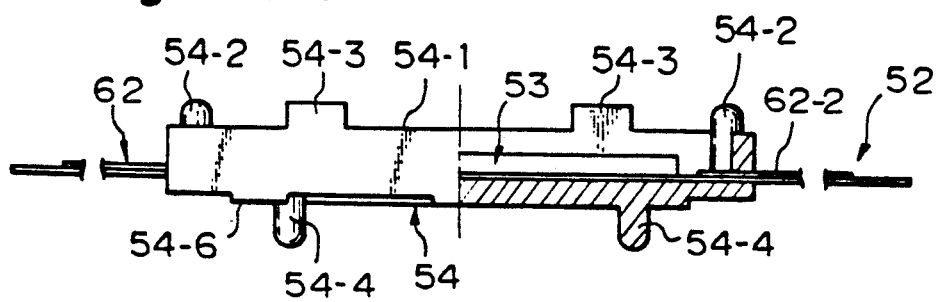
Figure 9C:
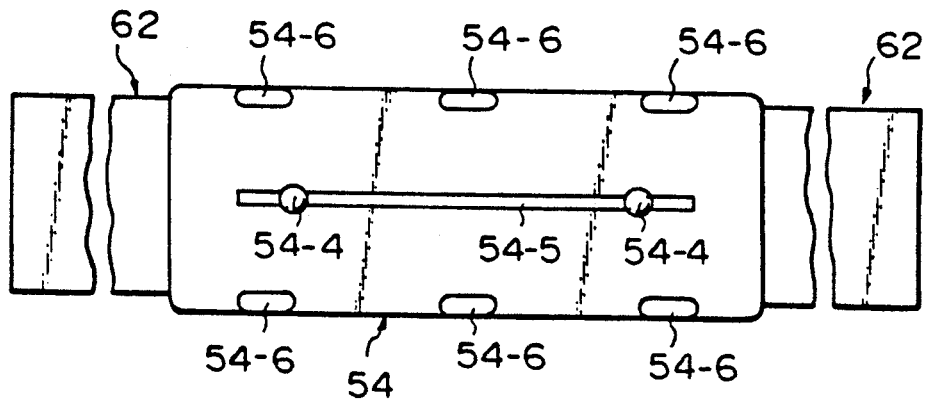

FIG. 9 illustrates the structure of a molded resin casing of an electronic part equipped with a flexible flat cable in accordance with a third embodiment of the present invention, in which: (A) is a plan view of the casing; (B) a partial side section of the same; (C) a back view; and (D) a sectional view taken along line A—A of FIG. 9(A).

In this embodiment, the casing is that of a sliding-type electronic part equipped with a flexible flat cable. As illustrated, the casing of this sliding-type electronic part includes a flexible board portion 53 and a flexible flat cable 62 integrally formed of a thermoplastic, heat-resistant film 51, with the flexible board portion 53 being inserted into a molded resin casing 54.

Resistor patterns 53-1 and collector patterns 53-2 are formed on the flexible board portion 53 by printing, and electric conductor patterns 62-1 continuous with the end portions of the collector patterns 53-2 and resistor patterns 53-1 are formed on the flexible flat cable 62 by printing. In addition, the surface of the flexible board portion 53 on which the resistor patterns 53-1 and the collector patterns 53-2 are formed is exposed at the bottom portion of the molded resin casing 54 in the interior thereof.

The structure, shape and method of manufacture of the components making up the foregoing sliding-type variable resistor casing will now be described.

Figure 10:
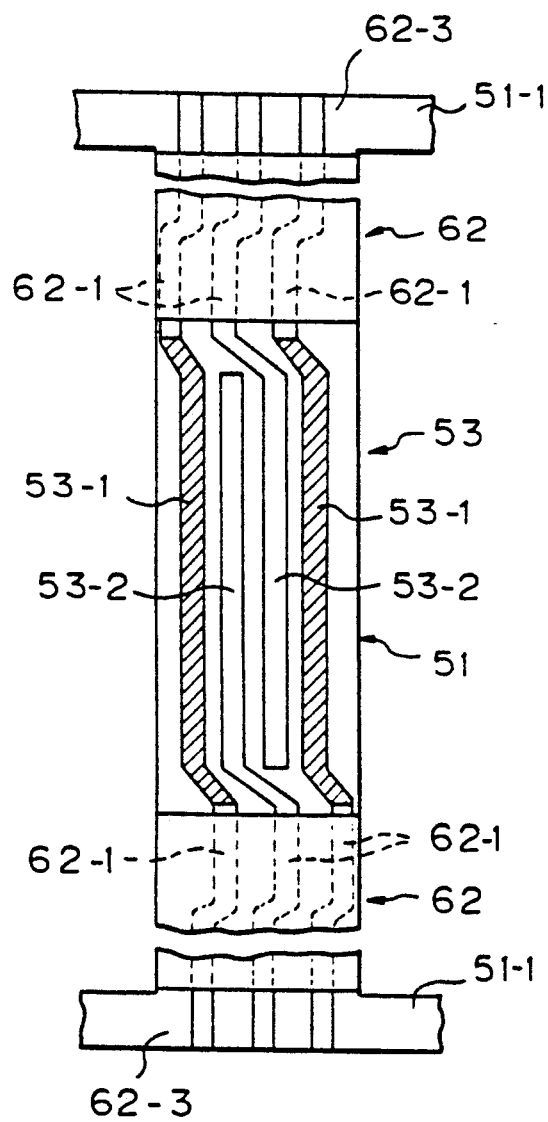
FIGS. 10 and 11 are views useful in describing a method of manufacturing a flexible board and a flexible flat cable, respectively.

FIG. 10 is useful in describing a process for manufacturing the flexible board portion 53 and the flexible flat cable 62. A heat-resistant film 51 is connected to support strips 51-1, 51-1 at both ends. The two resistor patterns 53-1, 53-1 and the two collector patterns 53-2, 53-2 are formed by printing on the surface of the heat-resistant film 51 at predetermined positions, and the conductor patterns 62-1 are printed on the heat-resistant film so as to be continuous with both ends of the resistor patterns 53-1, 53-1. Conductor patterns 62-1, 62-1 are printed on one end of each of the collector patterns 53-2, 53-2.

The portions of the heat-resistant film 51 on which the resistor patterns 53-1 and collector patterns 53-2 are formed by printing define the flexible board portion 53 which serves as the board of the sliding-type resistor, and the portions of the heat-resistant film 51 on which the conductor patterns 62-1 are formed define the flexible flat cables 62. An insulative coating film is applied to the upper portion of the electric conductor patterns 62-1, 62-1 with the exception of the end portions 62-3.

Figure 11:
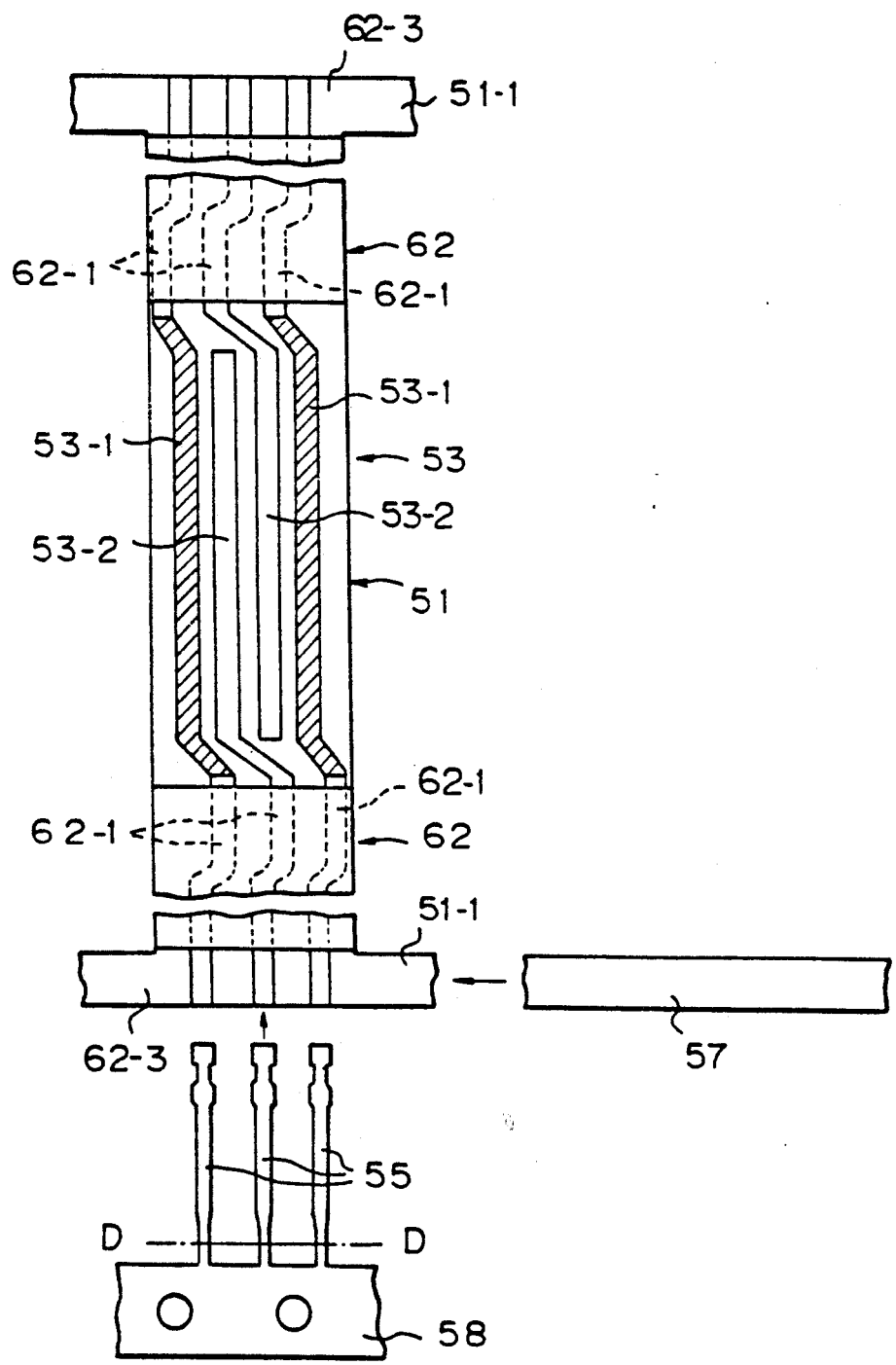

If the end portion of each flexible flat cable 62 is provided a terminal portion, metallic terminal pieces 55 formed integral with a supporting strip 58, as shown in FIG. 11, are placed on the end portions of the electric conductors 62-1 of flexible flat cable 62. A hot-melt electrically conductive adhesive layer is formed on the electric conductor patterns 62-1 of the flexible flat cables 62, the metallic electrode pieces 55 are placed on respective ones of these electric conductor patterns 52-1, a terminal securing film 57 of a substance the same as that of the heat-resistant film 51 is placed on the metallic terminal pieces 55 from above, and portions of the terminal securing film 57 at which the metallic terminal pieces 55 are not present are irradiated with ultrasonic waves from a horn (not shown) which emits ultrasonic waves. As a result, the terminal securing film 57 and the heat-resistant film 51 of the flexible flat cable portions 62 are locally fused by ultrasonic heating, so that the metallic terminal pieces 55 are rigidly bonded to the respective electric conductor patterns 62-1.

The metallic terminal pieces 55 are then contacted and heated by a heating iron from above the terminal securing film 57 or the heat-resistant film 51 of the end portion 62-3 to melt the aforementioned electrically conductive adhesive layer, thereby reliably bonding the metallic terminal pieces 55 onto the electric conductor patterns 62-1. As a result, terminals having an arrangement approximately the same as in FIG. 1(D) are formed. After the flexible board 53 formed integral with the flexible flat cables 62 is inserted in the molded resin casing 54 as mentioned above, the supporting strips 51-1, 51-1 are cut away, thereby completing the molded casing 54 of the sliding-type variable resistor.

If the end portion of the flexible flat cable 62 is provided with a terminal portion having the metallic terminal pieces 55, the support strip 58 is cut away along the line D—D in FIG. 11.

The side portions of the casing 54 are formed so as to cover the outer peripheries of the flexible board portion 53 and the terminal portions 52, as shown in FIG. 9, and four securing projections 54-2 for securing a cover plate, described below, and four guide projections 54-3 for guiding the cover plate are formed at both ends on one side portion 54-1. The rear side of the casing is integrally formed to include two fixing projections 54-4, 54-4 for fixing the molded resin casing 54 to a printed circuit board, described below.

Next, a method of inserting the flexible board portion 52 formed integral with the flexible flat cables 62 into the molded resin casing 54 will be described with reference to FIG. 12.

As shown in (A) of FIG. 12, the heat-resistant film 51 in which the flexible board portion 53 and the flexible flat cables 62 are integrally formed is clamped between a first die A and a second die B.

The first die A is formed to have a flat surface A1 which is brought into close contact with the surface of the flexible board portion 53 of the heat-resistant film 51 having the resistor patterns 53-1 and collector patterns 53-2 formed thereon, and a groove A2 for forming the side portions 54-1 of the molded casing 54. Though not shown, the bottom portion of the groove A2 is formed to have recesses for forming the securing projections 54-2 and the guide projections 54-3 of the molded resin casing 54.

The second die B has a recess B1 for forming the bottom portion of the molded casing 54 formed at a portion thereof which corresponds to the flat portion A1 and groove A2 of the first die A, and a channel B2 of a predetermined width for promoting the inflow of a molten resin material toward the portions of the molded resin casing 54 penetrated by the flexible flat cables 62 of heat-resistant film 51. The channel B2 is formed longitudinally of the recess B1 at the approximate center thereof. (An elongated projection on the rear side of the molding casing 54 is formed by this channel B2.) The second die B also has columnar recesses B3 formed at the center of the recess B1 at predetermined positions longitudinally thereof for forming the fixing projections 54-4, 54-4 on the rear side of the molded casing 54. Though not shown, the peripheral portion of the bottom of recess B1 is formed to have recesses for forming projections 54-6 on the molded casing 54.

Next, as shown in (B) of FIG. 12, a molten resin material (e.g., polyphenylene sulfide, polyethylene terephthalate or the like) is injected under pressure in the direction of the arrows D1 from filling bores B4 formed at the base ends of the recesses B3 of the second die B. Owing to this injection of the molten resin, the heat-resistant film 51 of the flexible board portion 53 is urged against the flat surface A1 of the first die A.

If the elongated channel B2 extending longitudinally along the center of the recess B1 of the second die B were not provided, the molten resin material at the time of the charging operation would flow around the die from the recess B1 through the surrounding groove A2 and would fill the die from the upper surface side of the flexible board portion 53 and flexible flat cables 62 at the groove A2, as indicated by arrow D2. As a result, the peripheral portions of the flexible board portion 53 and flexible flat cables 62 would be urged downwardly toward the recess B1 of the second cavity B. In extreme cases, there is the danger that this might cause the peripheral portions to become exposed at the back surface of the molded casing 54.

In this embodiment, however, the foregoing problem is avoided by forming the channel B2 longitudinally of the recess B1 along the center thereof in the second die B so that the flow of the molten resin material is promoted by the channel B2. Accordingly, the injection of the molten resin material is such that first the recess B1 is filled from the longitudinal direction thereof along its center (the direction indicated by arrow D3), then the periphery of the cavity and finally the groove A2. During this filling process, therefore, the flexible board portion 53 and the flexible flat cables 62 are urged against the side of the first die A, so that they will not separate from the flat surface A1 of the first die A. In other words, the molten resin material will not flow into the area between the flat surface A1 of the first die A and the flexible board portion 53. Consequently, when the first and second dies A, B are parted after the molten resin material solidifies, as will be described below, the surface of the flexible board portion 53 will be completely exposed at the bottom of the molded resin casing 54.

After the molten resin material thus charged into the area between the first and second dies A, B has solidified, the first and second dies A, B are parted. As a result, a casing of a sliding-type variable resistor such as that shown in FIG. 9 is completed.

Figure 13:
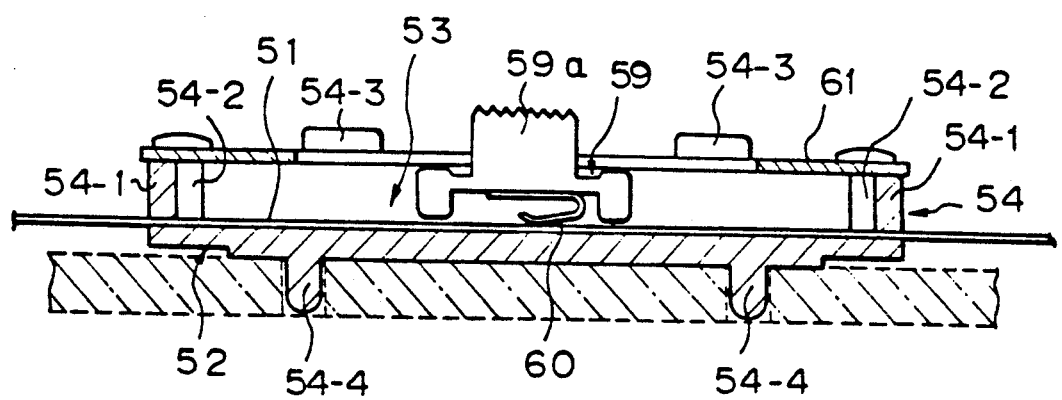
FIG. 13 is a sectional side view illustrating the structure of a sliding-type variable resistor fabricated using the molded resin casing of the electronic part with the flexible flat cable shown in FIG. 9.

FIG. 13 is a sectional side view illustrating the structure of a sliding-type variable resistor in which use is made of the above-described sliding-type variable resistor casing equipped with the flexible flat cables.

As illustrated, a sliding body 59 is placed upon the flexible board portion 53 inserted into the molded resin casing 54. Provided on the bottom portion of the sliding body 59 is a slider 60 brought into sliding contact with the resistor patterns 53-1 and collector patterns 53-2 formed on the flexible board 53. The upper portion of the sliding body 59 is formed integral with an operating lever 59a. A cover plate 61 is placed upon the upper part of the side portions 54-1 of molded casing 54 and the distal ends of the securing projections 54-2 are thermally caulked, whereby the sliding body 59 is retained between cover plate 61 and the flexible board portion 53. This completes the sliding-type variable resistor.

When the operating lever 59a in the sliding-type variable resistor having the above-described structure is operated to move the sliding body 59, the slider 60 slides on the resistor patterns 53-1 and collector patterns 53-2 to change the positions at which the contacts of the slider 60 contact the resistor patterns 53-1, thereby changing the resistance between the electric conductor patterns 62-1 of the flexible flat cables 62 connected to respective ones of the collector patterns 53-2 and resistor patterns 53-1.

As described hereinabove, the flexible board portion 53 on which the resistor patterns 53-1 and collector patterns 53-2 are formed and the flexible flat cables 62 on which the electric conductor patterns 52-1 are formed are made of the thermoplastic, heat-resistant film 51 consisting of synthetic resin, and the heat-resistant film 51 is insertion-molded in the molded casing 54 consisting of synthetic resin. As a result, not only is it no longer necessary to assemble the molded casing 54 and the flexible board portion 53, but it is also possible to reduce the size and thickness of the sliding-type variable resistor and dispense with the need to connect wires to the terminals of the electronic part.

In the foregoing embodiment, the invention is described in connection with a sliding-type variable resistor. However, the invention can be applied to a sliding-type code switch by changing the patterns formed on the flexible board portion 53.

Further, it has been described in the foregoing embodiment that the patterns are formed on the flexible board 53 by the printing application of an electrically conductive paste. However, the invention is not limited to this embodiment. By way of example, it is possible to form the patterns by forming an electrically conductive foil such as of aluminum or copper on the synthetic resin film by adhesion using an adhesive or by vacuum deposition, followed by forming the foil into predetermined pattern shapes by an etching treatment.

Figure 14:
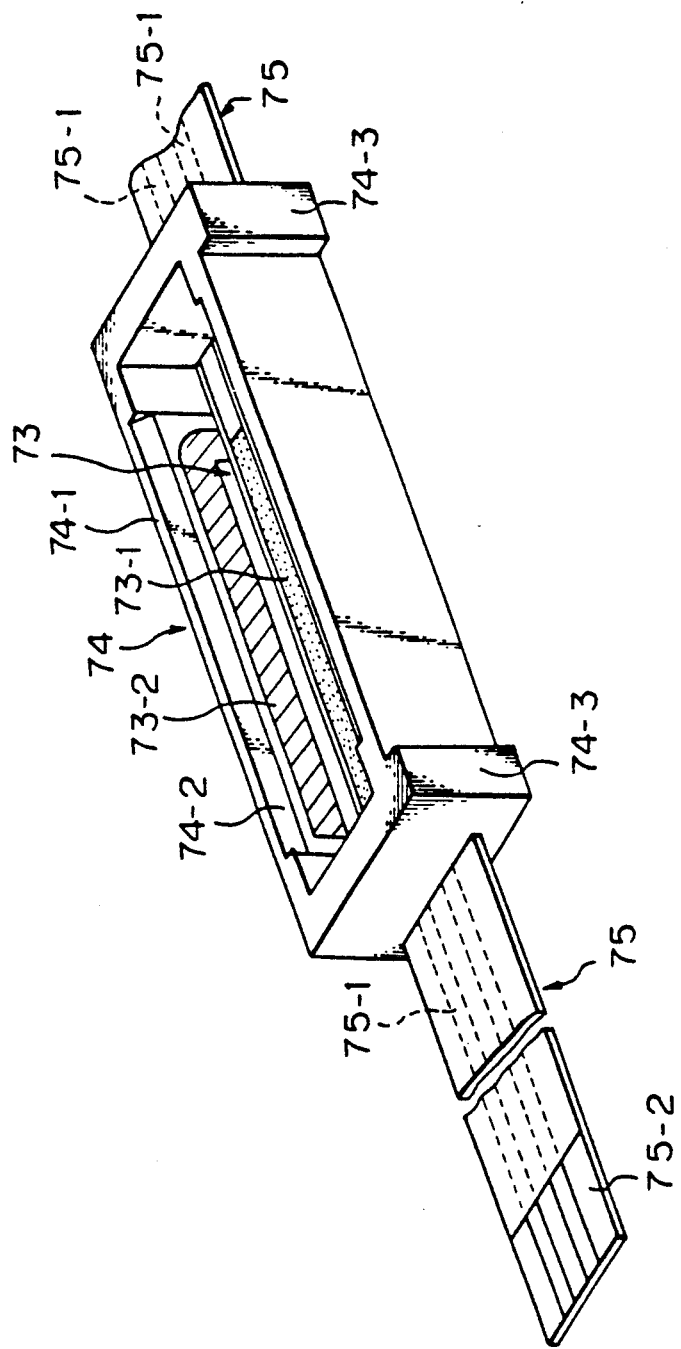
Figure 15A:
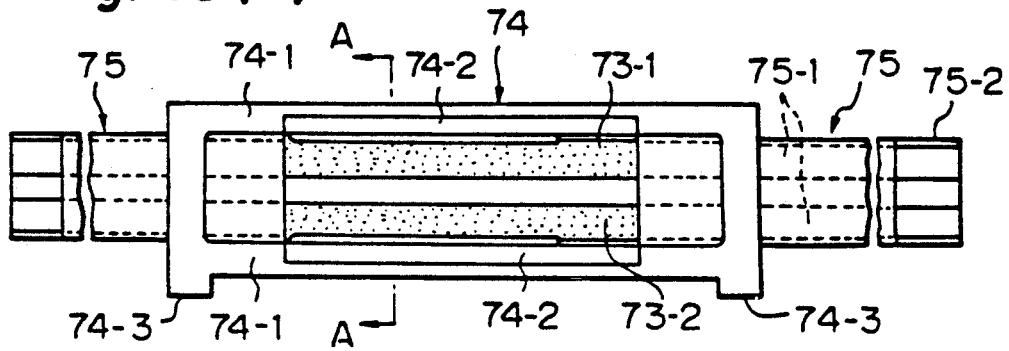
Figure 15B:
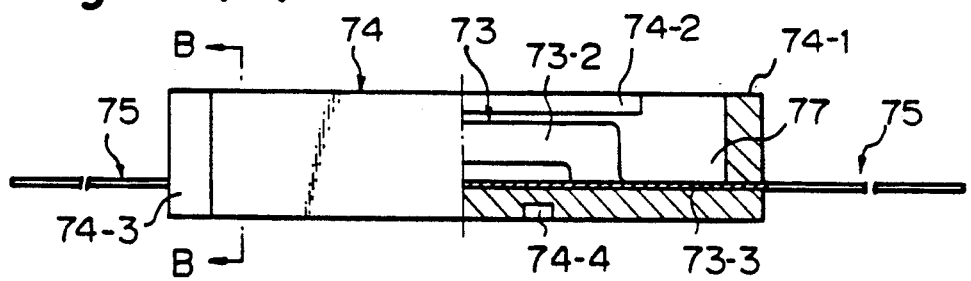
Figure 15C:
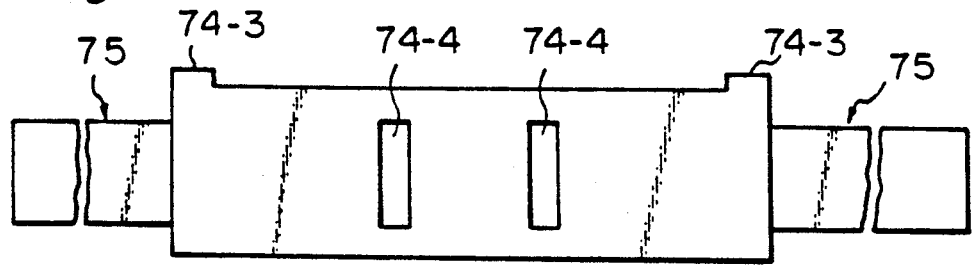
Figure 15D:
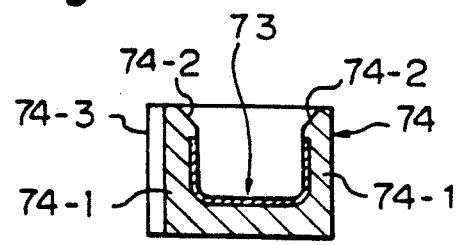

FIGS. 14 and 15 are views illustrating the structure of a molded resin casing of an electronic part in which the casing has a flexible flat cable in accordance with a fourth embodiment of the present invention, in which FIG. 14 is a perspective view, FIG. 15(A) a plan view of the casing, (B) a partial side section thereof, (C) a back view thereof, and (D) a sectional view taken along line A—A of FIG. 15(A). In this embodiment, a variable resistor will be described as the electronic part.

As illustrated, a flexible flat board 73 inserted in a molded resin casing and flat cables 75 are integrally formed of a heat-resistant film 71. Resistor patterns 73-1, 73-1 and collector patterns 73-2, 73-2 are printed on the flexible board 73, and electric conductor patterns 75-1, 75-1 continuous with end portions of the resistor patterns 73-1, 73-1 are printed on the flexible flat cable 75. An insulating film is formed by application of a resin material to the upper surface of each flexible flat cable 75 with the exception of the end portion thereof. The resistor patterns 73-1, 73-1 on the flexible board 73 are exposed at the bottom surface of the casing, and the collector patterns 73-2, 73-2 are exposed at the two opposing inner side wall surfaces of the casing.

The arrangement and method of manufacture of the components making up the foregoing electronic part casing will now be described.

Figure 16:
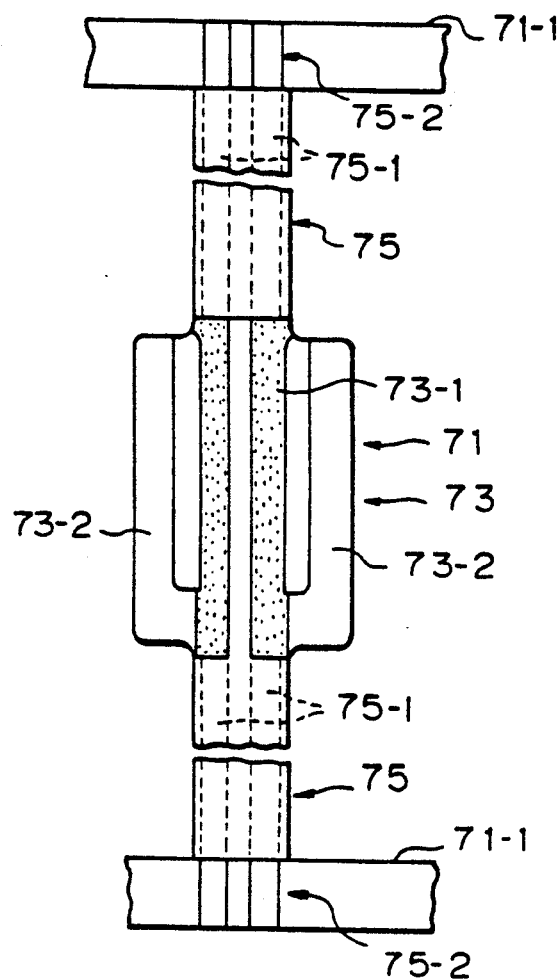
FIG. 16 is a view for describing a method of manufacturing the flexible flat cable and the flexible board.

FIG. 16 is a view useful in describing a process for manufacturing the flexible board 73 and the flexible flat cables 75. The flexible flat board 73 and flat cables 75 are connected to support strips 71-1, 71-1 integrally formed of heat-resistant film. Examples of the material usable to form the heat-resistant film 71 are polyparabanic acid, polyether imide and polyethylene. Two resistor patterns 73-1, 73-1 and two collector patterns 73-2, 73-2 are printed on the surface of the heat-resistant film 71 at predetermined positions to define a flexible board 73, and electric conductor patterns 75-1, 75-1 are printed on the flexible flat cables 75 that are continuous with the flexible board 73. The resistor patterns 73-1, collector patterns 73-2 and electric conductor patterns 75-1, 75-1 are connected in such a manner that one end of each resistor pattern 73-1 is connected to one end of the corresponding collector pattern 73-2 and one end of an electric conductor pattern 52-1 is connected to the junction of the resistor and collector patterns 73-1, 73-2. The width of the flexible board 73 of the heat-resistant film 71 is a predetermined dimension larger than the width of the flexible flat cable 75.

As set forth above, the flexible board portion 73 is inserted into the molded synthetic resin casing 74 in such a manner that the flexible flat cables 75 project to the outside. Thereafter, the support strips 71-1, 71-1 are removed thereby completing the molded casing of the electronic part having a flexible flat cable.

The side portions 74-1 of the molded resin casing 74 are formed so as to cover the outer peripheries of the flexible board portion 73 and the terminal portions 72, and projections 74-3 serving as stoppers are formed at both ends on one side of the casing 74. In addition, sloping surfaces 74-2 which slope inwardly of the casing 74 are formed at predetermined positions on the tops of the side portions 74-1.

Next, a method of inserting the flexible board 73 formed integral with the flexible flat cables 75 into the molded resin casing 74 will be described with reference to FIG. 18.

First, as shown in FIG. 18(A), the flexible board 73 and the flexible flat cables 75, 75 integrally formed of the heat-resistant film are clamped between a first die A and second die B.

The first die A is formed to have a flat surface A1 which is brought into close contact with the surface of the flexible board 73 of the heat-resistant film 71 having the resistor patterns 73-1, 73-1 formed thereon, and a groove A2 provided around the flat surface A1 for forming the side portions 74-1 of the molded casing 74.

The second die B has a recess B1 for forming the bottom portion of the molded casing 74 formed at a portion thereof which corresponds to the flat surface A1 and groove A2 of the first die A. In addition, projections B2, B2 are provided in the recess B1 at a predetermined spacing for the purpose of impeding the flow of a molten resin material in the longitudinal direction of the heat-resistant film 71 and promoting the flow of the molten resin material in the lateral direction of the film 71. Further, a filling bore B3 for charging a molten resin material is formed in the center of the recess B1.

A molten resin, such as polyphenylene sulfide, polyethylene terephthalate or the like, is introduced from the filling bore B3 under pressure as indicated by the arrow D1. Owing to the injection of the molten resin, the resin material flows into the recess B1 of the second die B. The flow of the resin material in the lateral direction (at right angles to the plane of the drawing) of the heat-resistant film 71 is promoted by the projections B2 formed in the recess B1, as shown in (C) of FIG. 18. As a result, the flexible board 73 of the heat-resistant film 71 is urged by the molten resin material and bent along one side surface of the groove A2, as shown in (B) of FIG. 18, so that the collector patterns 73-2 are brought into close contact with the side surface.

If the recess B1 of the second die B were not provided with the projections B2, the molten resin would flow radially from the filling bore B3 when introduced from the bore. In such case, the molten resin material which flows longitudinally of the recess B1 would flow into the groove A2 from the side portions of the flexible flat cables 75 and part of this resin would enter the area between the side surface of the groove A2 and the parts of the flexible board 73 on which the collector patterns 73-2 are formed, resulting in the surfaces of the collector patterns 73-2 being covered with the resin material. However, since in this embodiment the projections B2 are formed on the bottom of the recess B1, the flow of the molten resin material in the longitudinal direction of the recess B1 is impeded, while the flow of the molten resin in the lateral direction of the heat-resistant film 71 is promoted. Accordingly, the molten resin material which thus flows into the groove A2 causes the surface of the flexible board 73 to be bent along the slide surface of the groove A2, thus bringing the surface of the flexible board into close contact with the side surface of the groove. Thus, the front surfaces of the collector patterns 73-2 of flexible board 73 will not be covered with the resin material.

More specifically, since the molten resin material will not flow into the area between the side surfaces of the flat surface A1 of the first die A and the flexible board 73, when the first die A and second die B are parted after the resin material has solidified, as described below, the resistor patterns 73-1, 73-1 on the flexible board 73 are exposed at the bottom of the molded casing 74, and the collector patterns 73-2, 73-2 are exposed at the two opposing inner side walls.

After the molten resin material thus charged in the cavity between the first and second dies A, B has solidified, the first and second dies are parted. As a result, a variable resistor casing such as that shown in FIG. 14 is completed.

Figure 17A:
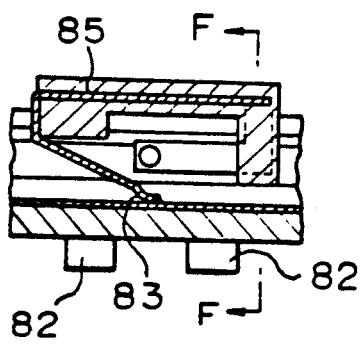
FIG. 17(A) is a partial side section [a sectional view taken along line E—E of FIG. 17(B)] and FIG. 17(B) is a sectional view taken along line F—F of FIG. 17(A)
Figure 17B:
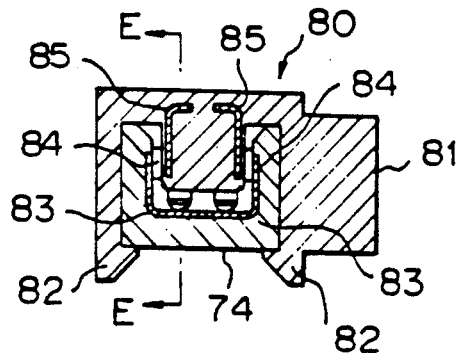
Figure 19:
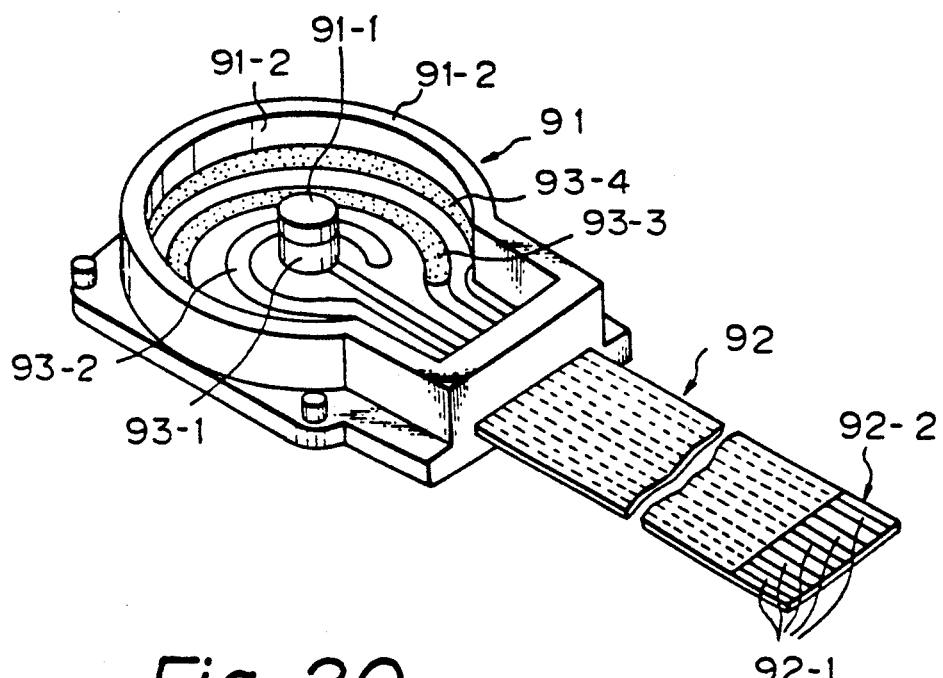
FIG. 19 is a perspective view illustrating the structure of a molded resin casing of an electronic part with a flexible flat cable in accordance with a fifth embodiment of the present invention.

FIG. 17 shows the structure of a variable resistor fabricated using the above-described molded resin casing 74, in which (A) is a partial side section [a sectional view taken along line E—E of FIG. 17(B)] and (B) is a transverse sectional view [a sectional view taken along line F—F of FIG. 17(A)]. As illustrated, a slider 80 is provided on the outer periphery of the variable resistor casing having the above-described structure. The slider 80 is molded of a resin material and has an operating knob 81 integral with one side portion thereof. Numeral 83 denotes contacts in sliding contact with the resistor patterns 73-1, 73-1 on the flexible board 73. Numeral 8 denotes contacts in sliding contact with the collect patterns 73-2. The contacts 83 and 84 are formed integral with each other in the form of a contact member 85, which is inserted in the body of the slider 85. Further, a pair of engagement members 82, 82 that are engaged with two edge portions of the outer surface of the bottom of molded casing 74 are formed on both sides of the slider 80.

With the upper part of the molded casing 74 abutting against the engagement members 82, 82 of the slider 80 having the above-described structure, the slider 80 is pressed. As a result, the engagement members 82 are spread apart, in which state they descend along the outer side surfaces of the slider 80 and, eventually, the respective projections of the engagement members 82, 82 engage with the outer peripheral bottom surface of the casing 74. Thus, a variable resistor prepared using the molded resin casing 74 is completed.

When the operating knob 81 of the variable resistor having the above-described construction is operated to move the slider 80 longitudinally of the molded resin casing 74, the contacts 83, 84 are caused to slide on the respective upper surfaces of the resistor patterns 73-1 and collector patterns 73-2, thus causing a change in the resistance between the electric conductor patterns 75-1, 75-1 of the flexible flat cables 75.

In the foregoing embodiment, an arrangement has been described in which the collector patterns 73-2 on the flexible board 73 are exposed at the two opposing inner side wall surfaces of the molded casing 74. However, the collector patterns 73-2 may be exposed at one inner side surface of the casing 74. Further, it is of course possible to vary the number of resistor patterns 73-1 and collector patterns 73-2 according to need. In addition, it is obvious that an arrangement can be adopted in which the resistor patterns 73-1, 73-1 are exposed at the inner side wall surfaces and the collector patterns 73-2, 73-2 are exposed at the bottom surface.

As has been described above, the flexible board 73 formed with the resistor patterns 73-1, 73-1 and collector patterns 73-2, 73-2 and the flexible flat cables 75 formed with the electric conductor patterns 75-1, 75-1 are integrally formed using a heat-resistant film 71 of a thermoplastic resin, and the flexible board 73 is arranged in such a manner that the resistor patterns 73-1, 73-1 are exposed at the bottom surface of the casing 74, while the collector patterns 73-2, 73-2 are exposed at the two opposing inner side wall surfaces. Therefore, it is possible to effectively utilize the inner surfaces of the molded casing 74 and, hence, reduce the size and thickness of the variable resistor, and it is no longer necessary to assemble the flexible board 73 and the molded casing 74 together. In addition, since the casing is equipped with the flexible flat cables, it is no longer necessary to connect wiring to the terminal portions if the molded casing is used.

Although in the above-described embodiments the present invention has been described by way of example in which the invention is applied to a sliding-type variable resistor, it should be noted that the molded casing of the invention is not limited thereto but can be utilized as the molded casing of a sliding-type switch as well. For example, it is possible to fabricate a miniature multiple-bit code switch by forming fixed contact patterns of a code switch on the inner bottom surface and both inner side surfaces of the above-described molded resin casing 74.

Further, it has been described in the foregoing embodiment that the patterns are formed on the flexible board 73 by the printing application of an electrically conductive paste. However, the invention is not limited to this embodiment. By way of example, it is possible to form the patterns by forming an electrically conductive foil such as of aluminum or copper on the synthetic resin film by adhesion using an adhesive or by vacuum deposition, followed by forming the foil into predetermined pattern shapes by an etching treatment.

FIG. 9 is a perspective view illustrating the structure of a molded resin casing of an electronic part equipped with a flexible flat cable in accordance with a fifth embodiment of the present invention. In this embodiment, the flexible board 93 is inserted into a molded resin casing 91 so as to be exposed at the inner surface of a side wall 91-2 and the outer peripheral surface of a support 91-1 of the casing 91. Here a flexible flat cable 92 formed integral with the flexible flat board 93 extends outwardly from the side portion of the molded resin casing 91. The method of inserting the flexible board 93 into the molded casing 91 is substantially the same as the method indicated in FIG. 4 and need not be described again.

By adopting this arrangement, a resistor pattern 93-4 is exposed at the inner surface of the side wall 91-2 of the molded resin casing 91, a resistor pattern 93-3 and a collector pattern 93-2 are exposed at the inner bottom surface, and a collector pattern 93-1 is exposed at the outer peripheral surface of the support 91-1. Further, the flexible flat cable 92 extends from the side portion of the molded resin casing 91. With the exception of a terminal portion 92-2, the flexible flat cable 92 has its upper surface coated with a resin material that forms an insulative film.

Figure 20:
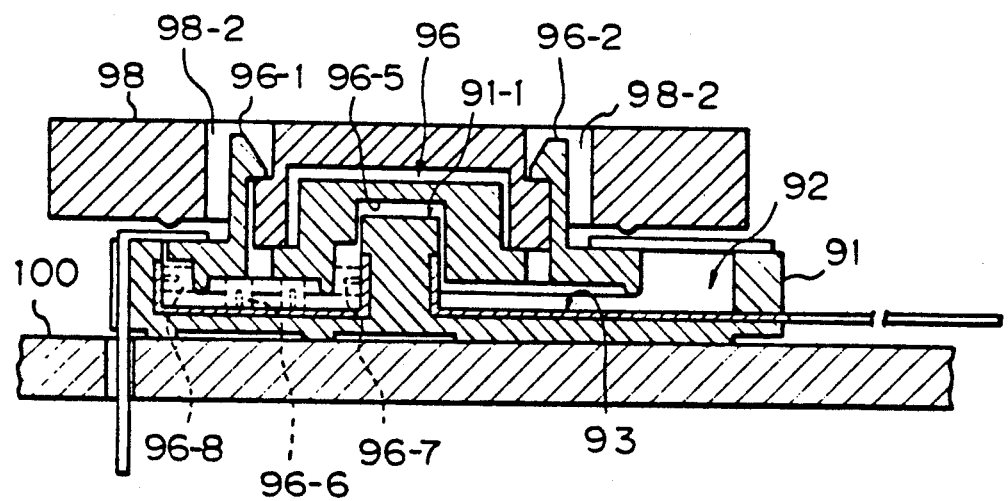
FIG. 20 is a sectional view illustrating a rotary-type variable resistor using the molded resin casing of FIG. 19.

FIG. 20 is a sectional view showing the rotary-type variable resistor, which is fabricated using the molded resin casing 91 having the above-described construction, mounted on the printed circuit board 100. The structure of this arrangement is substantially the same as that of the rotary-type variable resistor of FIGS. 7 and 8.

To assemble this rotary-type variable resistor, a rotor 96 is placed on the molded resin casing 91 with the support 91-1 formed on the central portion of the molded resin casing 91 being inserted into a hole 96-5 formed in the lower central portion of the rotor 96. Locking fingers 96-1, 96-2 are inserted into holes 98-2, 98-2 and made to engage step portions formed on the wall surfaces of the holes 98-2, 98-2, thereby attaching the rotating knob 98 to the rotor 96.

When the rotating knob 98 in the rotary-type variable resistor having the foregoing construction is turned, the rotor 96 rotates so that a slider 96-6 attached to the lower surface thereof is brought into sliding contact with the resistor pattern 93-2 and collector pattern 93-2 exposed at the inner bottom surface of the casing 91, a slider 96-7 attached to the inner peripheral surface of the rotor 96 is brought into sliding contact with the collector pattern 93-1 exposed at the outer peripheral surface of the support 91-1, and a slider 96-8 attached to the outer peripheral surface of the rotor 96 is brought into sliding contact with the resistor pattern 93-3 exposed at the inner surface of the side wall 91-2. This causes the resistance between the electric conductor patterns 92-1, 92-1 of flat cable 92 to change.

By constructing the molded resin casing in the manner described above, the inner surface of the molding casing 91 can be utilized effectively to make it possible to greatly reduce the size of the rotary-type variable resistor.

Although in the above-described embodiments the present invention has been described by way of example in which the invention is applied to a variable resistor, it should be noted that the molded casing of the invention can be utilized as the molded casing of a rotary-type code switch or the like by chaning the various patterns formed on the flexible board.

Further, in the foregoing embodiment, the patterns can be formed on the flexible board 93 by the printing application of an electrically conductive paste, and it is possible to form the patterns by forming an electrically conductive foil such as of aluminum or copper on the synthetic resin film by adhesion using an adhesive or by vacuum deposition, followed by forming the foil into predetermined pattern shapes by an etching treatment.

As many apparently widely different embodiments of the present invention can be made without departing from the spirit and scope thereof, it is to be understood that the invention is not limited to the specific embodiments thereof except as defined in the appended claims.

We claim:

1. A process for manufacturing a molded synthetic resin casing of an electronic part having an integrally attached flexible flat cable, comprising the steps of:
   preparing a first die having a flat surface which is brought into close contact with a surface of a flexible board including a resin film on which a first plurality of electric conductor patterns are formed, and a groove formed around the periphery of said flat surface for forming a side portion of the molded synthetic resin casing, the central portion of the flat surface of said first die having a hole for forming a support, and a second die disposed in opposing relation to said first die and having a casing bottom forming recess formed at a portion thereof corresponding to that portion of said first die which includes said flat surface and at least a part of said groove and having the surface of said second die which defines said recess being spaced from said flat surface of said first die;

clamping said flexible board having said integrally attached flexible flat cable between said first die and said second die for causing the surface having said first plurality of electrical conductor patterns formed thereon to be brought into abutting contact with the flat surface of said first die; and filling said recess between said first and second dies and said groove with a molten resin material by injecting said resin material from a central portion of said recess of the second die and causing the flexible board over the support forming hole to be punctured by the injection of the molten resin material, the flexible board being of a material and having a thickness for causing it to be folded back against the surface of said support forming hole and allowing the resin material to fill the support forming hole and holding the folded back portions of the flexible board against the surface of said support forming hole.

2. A process for manufacturing the molded resin casing of an electronic part having an integrally attached flexible flat cable as in claim 1, wherein the bottom portion of the recess of said second die has a channel of a predetermined width for promoting inflow of the molten resin material longitudinally of the flat cable.

3. A process for manufacturing the molded resin casing of an electronic part having an integrally attached flexible flat cable as in claim 1, wherein a central portion of said flexible board on which said first plurality of electrical conductor patterns is defined has a hole of a diameter smaller than the diameter of the support forming hole of said first die.

4. A process for manufacturing the molded resin casing of an electronic part having an integrally attached flexible flat cable as in claim 1, wherein the size of the portion of the flexible board on which said first plurality of electrical conductor patterns are formed has a predetermined dimension larger than the flat surface of said first die, and less than the outer periphery of said groove, whereby the injected molten resin surrounds the edge of said flexible board for integrally connecting the flexible board with the side portion of the casing molded in said groove.

* * * * *